(12) United States Patent
Kloster et al.

(10) Patent No.: US 7,122,481 B2
(45) Date of Patent: Oct. 17, 2006

(54) SEALING POROUS DIELECTRICS WITH SILANE COUPLING REAGENTS

(75) Inventors: Grant Kloster, Lake Oswego, OR (US); Chih-I Wu, Hillsboro, OR (US); Xiaorong Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 143 days.

(21) Appl. No.: 10/627,838

(22) Filed: Jul. 25, 2003

(65) Prior Publication Data

US 2005/0020074 A1    Jan. 27, 2005

(51) Int. Cl.
*H01L 21/302* (2006.01)
*B44C 1/22* (2006.01)

(52) U.S. Cl. ............... 438/725; 438/693; 438/723; 438/780; 216/46; 216/79

(58) Field of Classification Search ............... 438/706, 438/710, 714, 723, 725, 694, 696, 700; 216/13, 216/17, 18, 46; 427/240, 255.1; 106/287.1
See application file for complete search history.

(56) References Cited

U.S. PATENT DOCUMENTS

| 6,054,379 A | * | 4/2000 | Yau et al. ................... 438/623 |
| 6,451,436 B1 | * | 9/2002 | Komatsu et al. ............. 428/447 |
| 6,528,409 B1 | * | 3/2003 | Lopatin et al. .............. 438/618 |
| 6,537,896 B1 | * | 3/2003 | Catabay et al. .............. 438/474 |
| 6,596,467 B1 | * | 7/2003 | Gallagher et al. ........... 430/314 |
| 2004/0013858 A1 | * | 1/2004 | Hacker et al. ........... 428/195.1 |
| 2004/0072436 A1 | * | 4/2004 | RamachandraRao et al. ........................... 438/692 |
| 2004/0214427 A1 | * | 10/2004 | Kloster et al. .............. 438/637 |

* cited by examiner

*Primary Examiner*—Shamim Ahmed
*Assistant Examiner*—Eric B. Chen
(74) *Attorney, Agent, or Firm*—Blakely, Sokoloff, Taylor & Zafman LLP

(57) ABSTRACT

A method and structure for sealing porous dielectrics using silane coupling reagents is herein described. A sealant chain (silane coupling reagent) is formed from at least silicon, carbon, oxygen, and hydrogen and exposed to a porous dielectric material, wherein the sealant chain reacts with a second chain, that has at least oxygen and is present in the porous dielectric defining the pores, to form a continuous layer over the surface of the porous dielectric.

27 Claims, 6 Drawing Sheets

SEALING POROUS DIELECTRICS WITH SILANE COUPLING REAGENTS

FIELD

This disclosure generally relates to the field of fabricating semiconductor devices. More specifically, it relates to sealing porous dielectric materials.

BACKGROUND

Modern integrated circuits generally contain several layers of interconnect structures fabricated above a substrate. The substrate may have active devices and/or conductors that are connected by the interconnect structure.

Interconnect structures, typically comprising trenches and vias, are usually fabricated in, or on, an interlayer dielectric (ILD). It is generally accepted that, the dielectric material in each ILD should have a low dielectric constant (k) to obtain low capacitance between conductors. Decreasing this capacitance between conductors, by using a low dielectric constant (k), results in several advantages. For instance, it provides reduced RC delay, reduced power dissipation, and reduced cross-talk between the metal lines.

To obtain the desired low dielectric constant, porosity is often introduced into the dielectric material. These pores typically increase problems that inherently exist when further processing is done on dielectric material. For example copper formed in the trenches and vias, without a barrier, may diffuse into an underlying layer causing the shorting of adjacent copper lines or line-to-line leakage. Moreover, when vias and trenches are etched in the porous dielectric material, pores are often exposed on the surface of the dielectric. Therefore, interconnect structures employ a barrier layer over the surface of the dielectric to protect from copper diffusing into the dielectric material. Common materials used for this barrier layer are tantalum, tantalum-nitride, and titanium nitride.

Yet, any discontinuity, like discontinuities 130 in FIG. 1a, in barrier film 120 will result in the diffusion of copper atoms or penetration of plating solution into dielectric 110. This diffusion can also cause copper lines to short or leakage from line-to-line to occur, as well as destruction of dielectric material 110. As shown in FIG. 1b, prior art requires the deposition of a thicker barrier layer 140, typically greater than 30 nm, to physically cover the exposed pores and adequately protect dielectric 110. Nevertheless, this thicker barrier layer takes up additional volume in a via or a trench increasing the resistance by reducing the volume available for copper and adding series resistance to an underlying copper connection.

These integration challenges are also present in related art methods of sealing the exposed pores on the surface of dielectric materials. One technique requires the use of thin films of material, such as SiC, to seal the pores; yet, these thin films often take too much volume and increase the dielectric constant of the interconnect structure. Another technique requires the use of plasma gas, such as nitrogen, argon, or helium, to increase the density of the dielectric surface. Nevertheless, plasma is very directional, which makes deposition of a continuous film extremely difficult.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of specific sealant chains, dielectric materials, deposition methods, and reactions in order to provide a thorough understanding of the present invention. It will be apparent, however, to one skilled in the art that these specific details need not be employed to practice the present invention. In other instances, well known processing steps, such as deposition methods, masking, and etching, have not been described in detail in order to avoid unnecessarily obscuring the present invention.

Figure 1A:
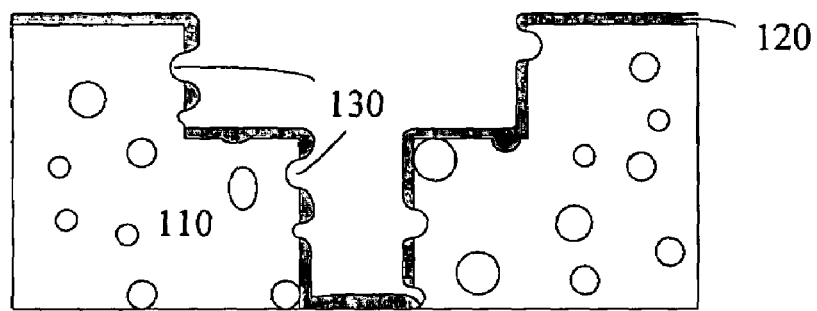
FIG. 1a is a prior art cross-sectional elevation view of a trench and via defined by a porous interlayer dielectric, after a thin film has been deposited over the surface of the dielectric.
Figure 1B:
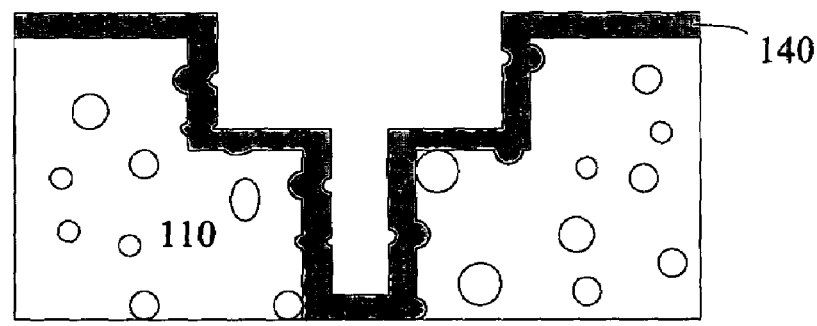
FIG. 1b is a prior art cross-sectional elevation view of a trench and via defined by a porous interlayer dielectric, after a thick barrier layer has been deposited over the surface of the dielectric.
Figure 2:
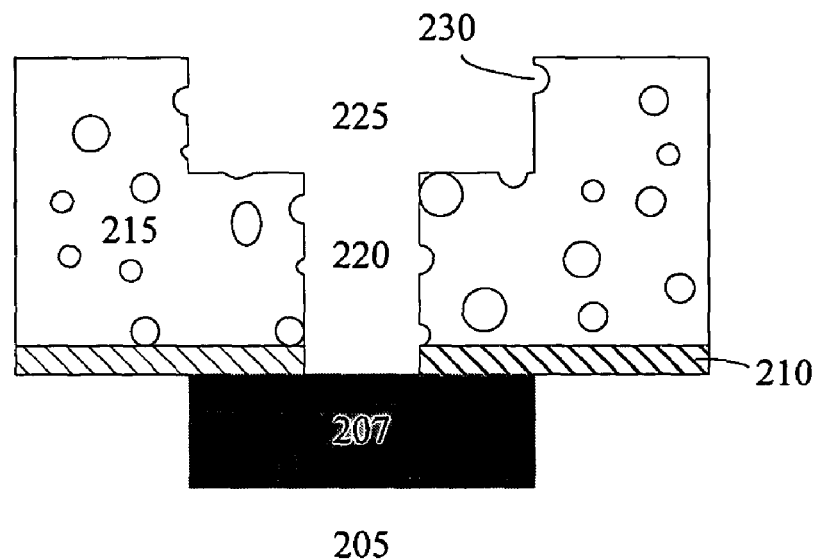
FIG. 2 is a cross-section elevation view of a porous dielectric material, disposed on an underlying layer, after a via and a trench have been etched into the porous dielectric material.

Referring first to FIG. 2, an underlying layer 205 is illustrated, which often is comprised of several active devices and/or a layer with metal exposed. Underlying layer 205 may be a semiconductor wafer including device regions, other structures such as gates, local interconnects, metal layers, or other active/passive device structures or layers. An etch stop 210 is also illustrated in FIG. 2, which can be comprised of numerous materials. For example, etch stop 210 may be comprised of silicon nitride ($Si_3N_4$) or silicon carbide (SiC).

FIG. 2 further illustrates a porous interlayer dielectric (ILD), such as ILD 215, which is disposed on underlying layer 205. ILD 215 may be formed from any one of a plurality of known dielectric materials. As an illustrative example ILD 215 may be an oxide/spin-on glass. Some examples of oxide dielectrics include: LKD-5109, which may be obtained from JSR CORPORATION; NANO-GLASS® E, which may be obtained from HONEYWELL INTERNATIONAL INC.; and ZIRKON®, which may be obtained from SHIPLEY COMPANY LLC. As another illustrative example, ILD 215 may be a polymer. Some examples of polymer dielectrics are porous silk, which may be obtained from DOW CHEMICAL COMPANY and GX-3P, which may be obtained from HONEYWELL INTERNATIONAL INC.

After forming ILD 215, vias and trenches, such as via 220 and trench 225 in FIG. 2, are etched into ILD 215 and through etch stop 210. This etching process often exposes pores, which are defined by ILD 215, such as pore 230 in FIG. 2. Ordinary masking and etching processes are used to form trench 220, via 225, and any other trenches or vias needed within ILD 215.

Figure 3:
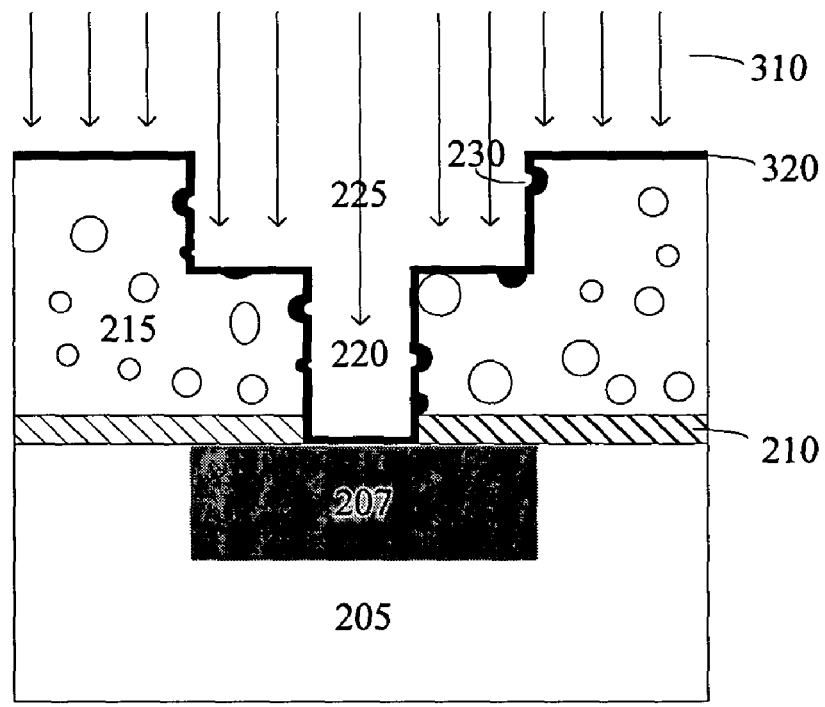
FIG. 3 illustrates the structure of FIG. 2, after deposition of a silane coupling reagent.

Next, as illustrated in FIG. 3, the surface of porous dielectric is exposed to a sealant chain 310, such as a silane coupling reagent, to seal pores, such as pore 230. Specific sealant chains (silane coupling reagents) are discussed in reference to FIGS. 4a–4c.

Exposing/treating ILD 215 with sealant chain 310 may be done in several ways. As an illustrative example, sealant chain 310 may be exposed to ILD 215 by chemical vapor deposition. More specifically, sealant chain 310 may be deposited using bubble vapor deposition, wherein sealant chain 310 is bubbled into vapor and a carrier gas, such as nitrogen or argon, is used to expose sealant chain 310 to ILD 215. Bubble vapor deposition may be done at normal pressure within a temperature range of 100 to 500 degrees Celsius. As another illustrative example, ILD 215 may be treated by dip-coating ILD 215 in a solution comprising sealant chain 310. As another illustrative example, sealant chain 310 may be exposed to ILD 215 by spin-coating, wherein sealant chain 310 is spun onto ILD 215.

Once sealant chain 310 is exposed to ILD 215, sealant chain 310 reacts with a second chain, which has at least oxygen and is present in ILD 215, to form continuous layer 320. As an illustrative example, continuous layer 320 may comprise silicon dioxide. Continuous layer 320 may also comprise condensed Si—OCH$_3$ groups. Moreover, continuous layer 320 may be bonded to ILD 215 by single or multiple bonds, as well as covalently linked to ILD 215. Specific explicatory examples of the second chain that sealant chain 310 reacts with are discussed in reference to FIGS. 4a–4c. A descriptive example of a specific reaction of sealant chain 310 and ILD 215 is discussed in reference to FIG. 5.

Figure 4A:
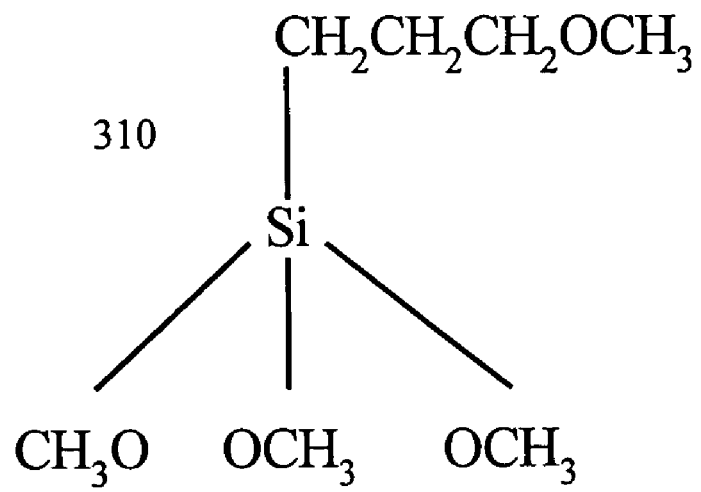
FIG. 4a illustrates a representation of a silane coupling reagent, methoxypropyltrimethoxysilane, for oxide dielectric materials.
Figure 4B:
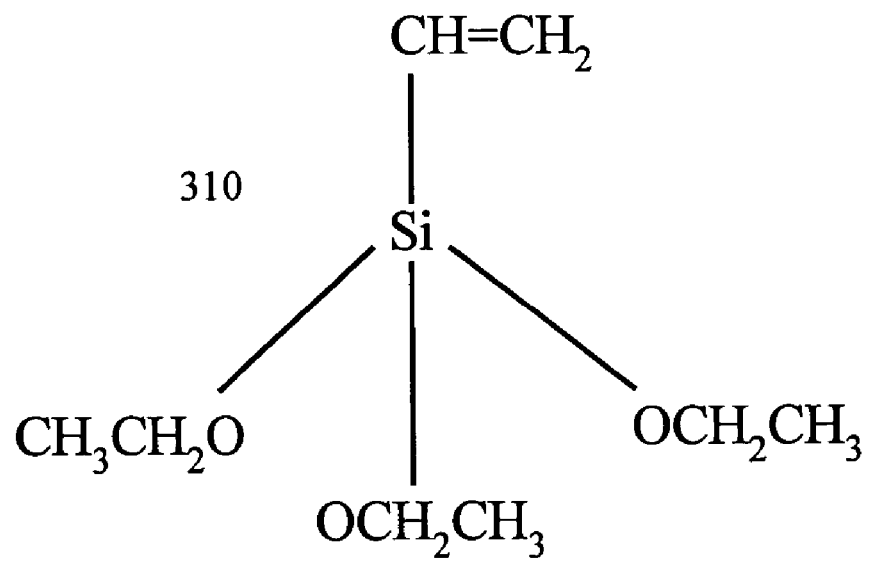
FIG. 4b illustrates a representation of a silane coupling reagent, vinyltriethoxysilane, for polymer dielectric materials.
Figure 4C:
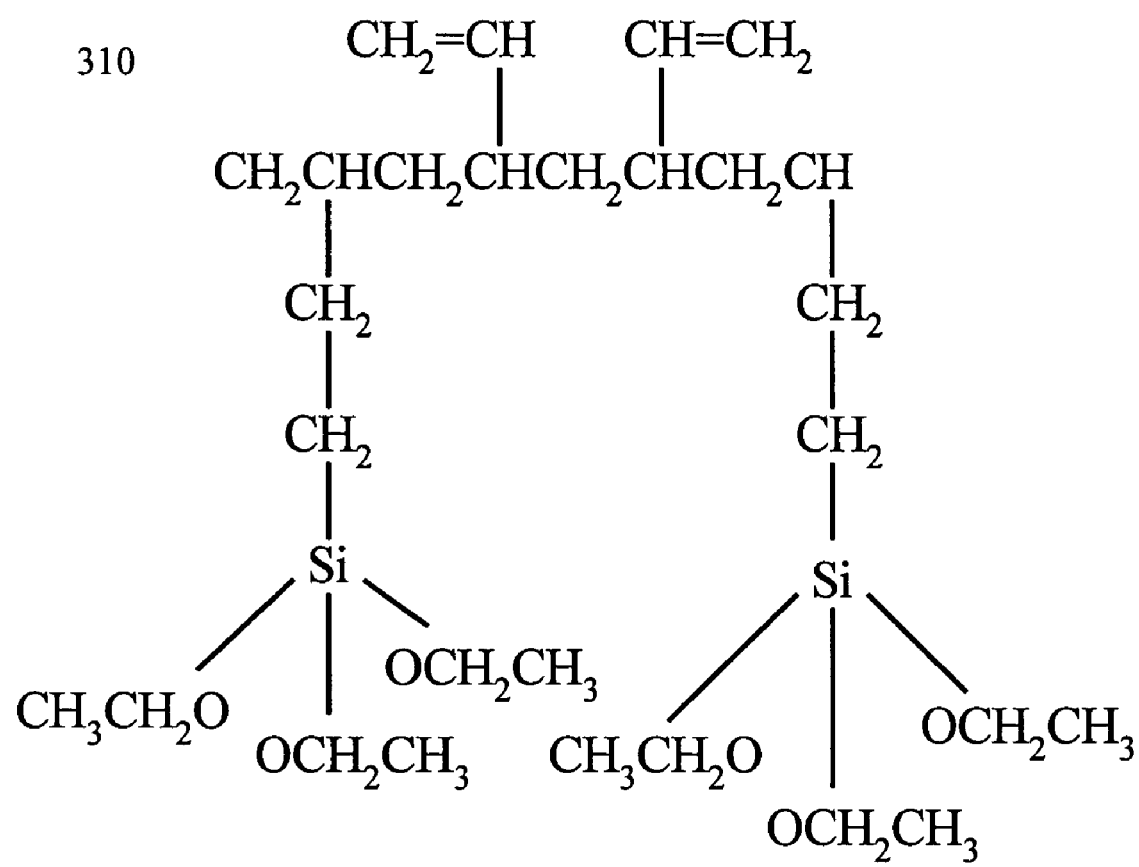
FIG. 4c illustrates a representation of an oligomeric silane coupling reagent.

Turning to FIGS. 4a–4c illustrative examples of sealant chain 310 and second chains present in ILD 215 are discussed. FIG. 4a illustrates a sealant chain or silane coupling reagent for oxide dielectric materials (oxide). A sealant chain for an oxide should have at least Si—OR groups, where R is an alkyl group such methyl, ethyl, or tertiary-butyl, to react with surface Si—OH groups present in ILD 215. Surface pre-treatments with bases such as potassium hydroxide or tetramethylammonium hydroxide can be used to enhance the reactivity of the sealant with the surface groups. As an illustrative example, alkoxysilanes or trialkoxysilanes may be used for sealant chain 310. FIG. 4a depicts an alkoxysilane, methoxypropyltrimethoxysilane, wherein the Si—OCH$_3$ group reacts with the Si—OH groups present in ILD 215 to form continuous layer 320, followed by condensation of the remaining Si—OCH$_3$ groups.

FIG. 4b illustrates a sealant chain/silane coupling reagent for polymer dielectric materials (polymers). A sealant chain for a polymer should have at least CH=CH2 to react with surface C—OH or C=O groups present in ILD 215. As an illustrative example, alkoxyvinylsilanes or trialkoxyvinylsilanes may be used for sealant chain 310. Often for polymers a co-reagent, such as an oxidant, must be exposed to the surface of ILD 215 to prepare it for reaction with the sealant chain. For example, peroxide may be exposed to the surface of ILD 215 to prepare it for reaction. FIG. 4a depicts an alkoxyvinylsilane, vinyltriethoxysilane, wherein the CH=CH2 group reacts with surface C—OH or C=O groups to form continuous film 320, followed by condensation of remaining SI—OCH$_3$ groups.

FIG. 4c illustrates a sealant chain/oligomeric silane coupling reagent that seals pores more efficiently due to a larger number of side chains to react with the surface and a larger coverage area per molecule. An oligomeric silane coupling reagent may be configured both in size and structure to seal pores more efficiently. For example, a dimer, such as the structure shown in FIG. 4c, may be used. It is readily apparent that one may use any number of side chains in designing an oligomeric silane coupling reagent to seal pores.

Furthermore, the size of the oligomeric silane coupling reagent may be varied to seal a pores, such as pore 230, with one or more atoms. Pore sizes are generally on the order of 20–100 A. The silane coupling reagents discussed in FIGS. 4a–4b typically have an approximate atomic radii of 3 A; therefore, requiring 6 to 30 atoms to seal a pore. An oligomeric structure may be designed to be 20 to 100 A in siz, filling a pore, such as pore 230, with one atom, not requiring any further condensation.

Figure 5:
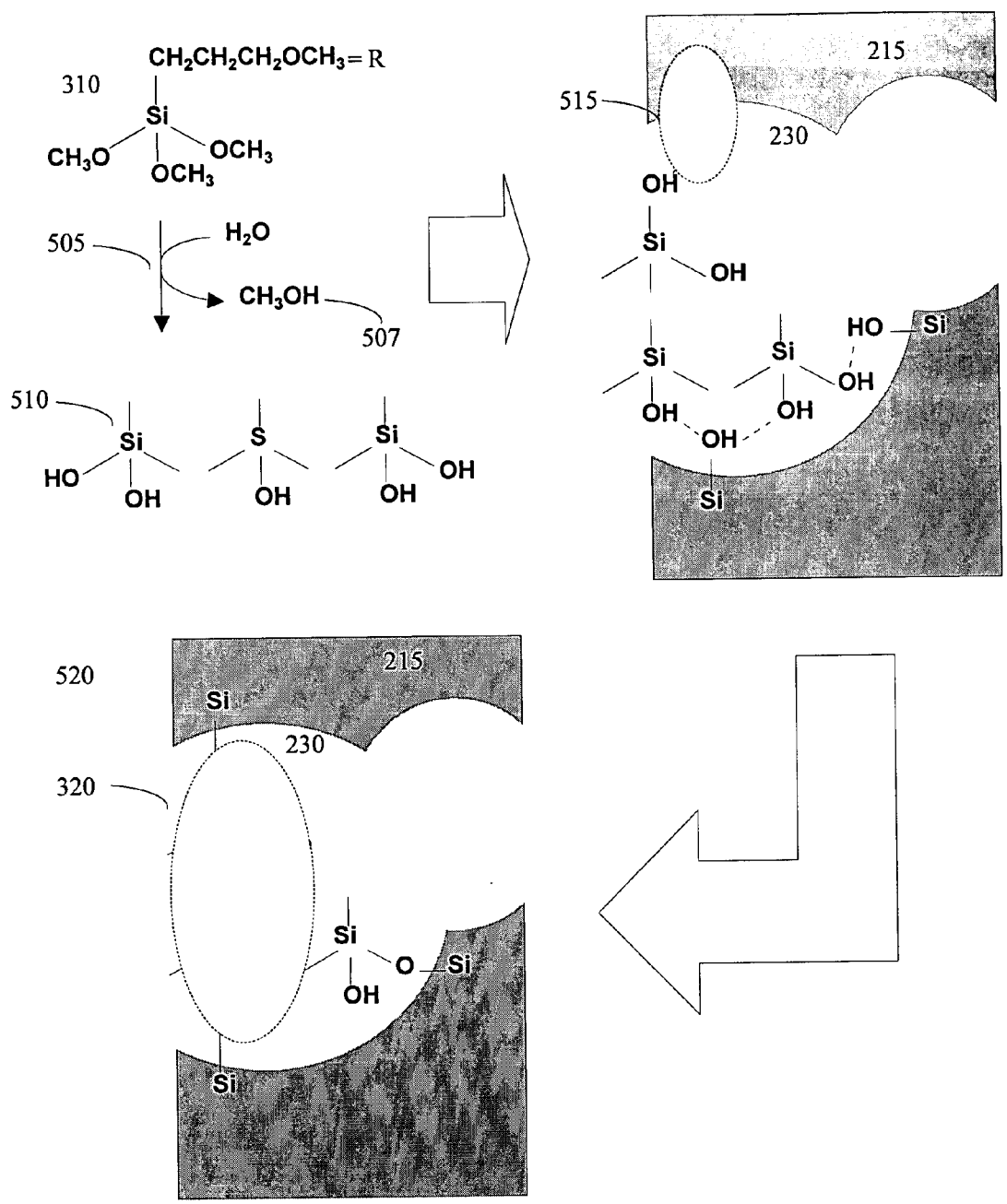
FIG. 5 illustrates an enlarged view of the reaction that forms the structure of FIG. 3.

Turning to FIG. 5, an illustrative example of sealant chain 310 reacting with a second chain present in ILD 215 is depicted. Chain 310 and 510 have an R side chain which may include any number of CH/CH$_2$ bonds, as well as an OCH$_3$ bond to react with oxide dielectric materials or a double/triple bond, such as CH=CH$_2$, to react with polymer dielectric materials. It is readily apparent that R may be changed to give the desired surface properties after the pores are sealed.

As an illustrative example, FIG. 5 depicts a reaction with an oxide; therefore, sealant chain 310 has an R comprising CH$_2$CH$_2$CH$_2$OCH$_3$. Sealant chain 310 reacts with water, in step 505, to form chain 510 creating by-product (CH$_3$OH) 507. Chain 510 is formed from the reaction between sealant chain 310 and water, still comprising the R side chain. Chain 510 is then exposed to ILD 215, which for this example is an oxide. As seen in step 515, the Si—OH groups, present in ILD 215 that defines pore 230, react with Chain 510. The next step, step 520, illustrates the formation of continuous layer 320 from the reaction with the Si—OH groups in step 515, wherein continuous layer 320 comprises SiO$_2$ and condensed SiOH groups. Step 520 also depicts the same side chain (R), from sealant chain 310, on the surface of pore 230. Therefore, R may be modified to obtain the desired surface properties after sealing pore 230.

Figure 6A:
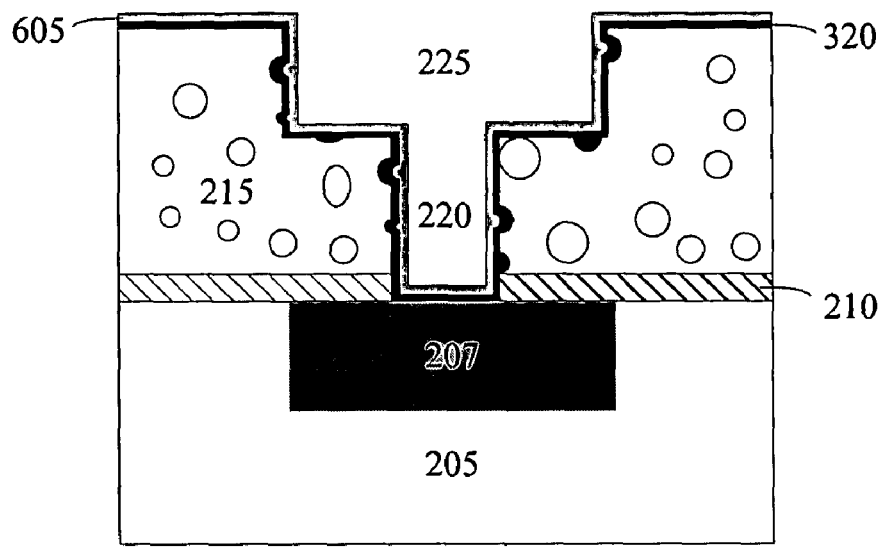
FIG. 6a illustrates the structure of FIG. 3, after a barrier layer has been deposited.
Figure 6B:
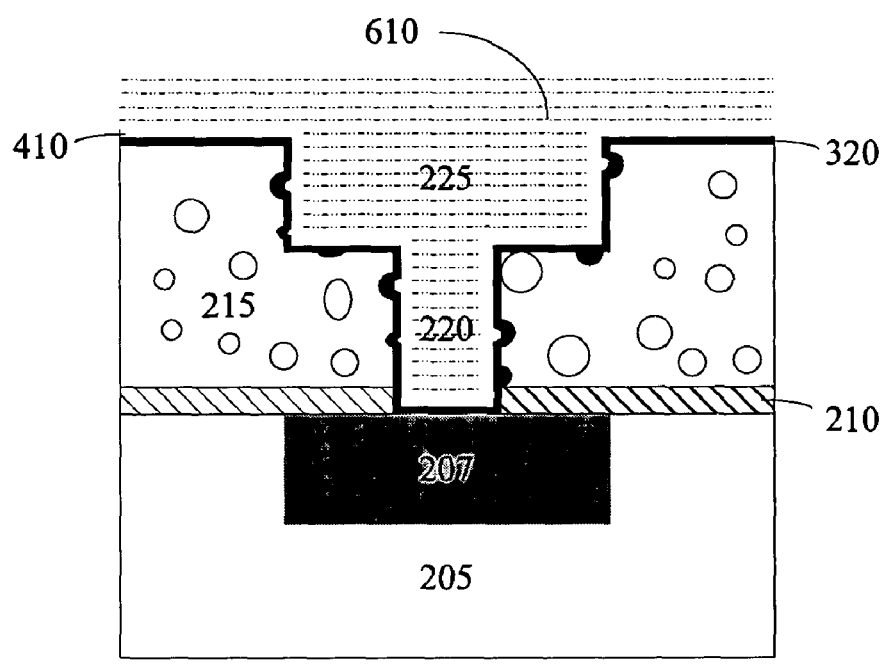
FIG. 6b illustrates the structure of FIG. 3, after a metal conductor has been deposited.

Referring to FIGS. 6a–6b, illustrative examples of conductive layers that may be formed after pore sealing are depicted. In FIG. 6a, a barrier layer 605 is formed on the surface of ILD 215 over continuous layer 320. In one embodiment, barrier layer 605 is comprised of tantalum (Ta). In another embodiment, barrier layer 605 is comprised of tantalum nitride (TaN). Other materials, such as Ta/TaN bilayers, TiN, WCN, TiSiN, may be used for barrier layer 605. Tantalum may be deposited using known methods of deposition, such as physical vapor deposition (PVD). Other methods of deposition may include ALD (atomic layer deposition) and MOCVD (metalorganic chemical vapor deposition).

FIG. 6b illustrates the forming of a metal conductor 610 in via 220 and trench 225. In one embodiment metal conductor 610 is comprised of copper. Metal conductor 610 may also include a copper alloy or some other conductive metal. An ordinary plating process may be used to form metal conductor 610.

It is readily apparent that a barrier layer, such as barrier layer 605, may be formed on ILD 215 and then copper alloy 610 may be formed in via 220 and trench 225. It is also readily apparent from FIGS. 6a–6b that these conductive layers may be formed on ILD 215 independently.

Therefore, sealing pores in porous dielectric using silane coupling reagents, allows one to effectively seal the dielectric material, protecting it from wet chemical processing steps; yet, sealing at this atomic level does not take up additional room in the via or trench, thereby, increasing the amount of room to form a metal conductor.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
    forming a porous interlayer dielectric;
    etching a via and a trench in the porous interlayer dielectric; and
    exposing the dielectric to a silane coupling reagent comprising an oligomer of an alkoxysilane, to form a continuous layer over the surface of the interlayer dielectric.

2. The method of claim 1, wherein the interlayer dielectric is an oxide.

3. The method of claim 1, wherein the interlayer dielectric is a polymer.

4. The method of claim 1, wherein the continuous layer comprises $SiO_2$.

5. A method comprising:
    etching a via and a trench in a dielectric, wherein the dielectric has a plurality of pores;
    exposing the dielectric to an oxidant to prepare the surface of the dielectric;
    treating the surface of the dielectric with a silane coupling reagent after exposing the dielectric to the oxidant to seal the pores exposed on the surface of the dielectric, the silane coupling reagent having an oligomeric structure; and
    forming a conductive layer on the surface of the dielectric.

6. The method of claim 5, wherein the dielectric is an oxide.

7. The method of claim 6, wherein the silane coupling reagent comprises an alkoxysilane.

8. The method of claim 7, wherein the alkoxysilane is methoxypropyltrimethoxysilane.

9. The method of claim 5, wherein the dielectric is a polymer.

10. The method of claim 9, wherein the silane coupling reagent comprises a alkoxyvinylsilane.

11. The method of claim 10, wherein the alkoxyvinylsilane is vinyltriethoxysilane.

12. The method of claim 5, wherein the oligomeric structure is a dimer.

13. The method of claim 5, wherein the oligomeric structure is designed to fill a pore with one molecule.

14. The method of claim 5, wherein treating comprises bubble vapor deposition of the silane coupling reagent.

15. The method of claim 14, wherein the bubble-vapor deposition carrier gas comprises Nitrogen ($N_2$).

16. The method of claim 14, wherein the bubble-vapor deposition carrier gas comprises Argon.

17. The method of claim 5, wherein treating comprises spin-coating the silane coupling reagent onto the dielectric.

18. A method comprising:
    forming a dielectric having a pore; and
    exposing the surface of the dielectric to a silane coupling reagent, wherein the silane coupling reagent comprises an oligomeric structure designed to fill the pore with one molecule.

19. The method of claim 18, wherein the dielectric comprises an oxide.

20. The method of claim 19, wherein the oligomeric structure comprises monomers of a trialkoxysilane.

21. The method of claim 18, wherein the dielectric is a polymer.

22. The method of claim 21, wherein the oligomeric structure comprises monomers of trialkoxyvinylsilane.

23. The method of claim 22, further comprising: exposing the dielectric to an oxidant to prepare the surface of the dielectric.

24. The method of claim 23, wherein the oxidant comprises peroxide.

25. The method of claim 18, wherein the silane coupling reagent comprises an oligomeric structure.

26. The method of claim 18, wherein the continuous film comprises an $SiO_2$ film covalently linked to the porous dielectric.

27. The method of claim 18, wherein a plurality of Si—$OCH_3$ groups condense on the porous dielectric.

* * * * *